United States Patent [19]
Barbier et al.

[11] Patent Number: 5,754,827
[45] Date of Patent: May 19, 1998

[54] METHOD AND APPARATUS FOR PERFORMING FULLY VISIBLE TRACING OF AN EMULATION

[75] Inventors: Jean Barbier, Chatillon; Olivier LePape, Paris; Frederic Reblewski, Les Molieres, all of France

[73] Assignee: Mentor Graphics Corporation, Wilsonville, Oreg.

[21] Appl. No.: 542,946

[22] Filed: Oct. 13, 1995

[51] Int. Cl.$^6$ .................................................. H03K 19/177
[52] U.S. Cl. .................... 395/500; 395/184.01; 364/578; 371/22.2; 326/41
[58] Field of Search ............................. 395/500, 184.01; 364/578; 371/22.2, 25; 326/41

[56] References Cited

U.S. PATENT DOCUMENTS

| | | | |
|---|---|---|---|
| 4,636,945 | 1/1987 | Tanagawa et al. | 364/200 |
| 4,674,089 | 6/1987 | Poret et al. | 371/25 |
| 4,879,646 | 11/1989 | Iwasaki et al. | 364/200 |
| 4,954,942 | 9/1990 | Masuda et al. | 364/200 |
| 5,036,473 | 7/1991 | Butts et al. | 364/489 |
| 5,109,353 | 4/1992 | Sample et al. | 364/578 |
| 5,321,825 | 6/1994 | Phillips et al. | |
| 5,345,580 | 9/1994 | Tamura et al. | 395/500 |
| 5,444,859 | 8/1995 | Baker et al. | 395/575 |
| 5,560,036 | 9/1996 | Yoshida | 395/800 |
| 5,564,041 | 10/1996 | Matsui et al. | 395/500 |
| 5,608,867 | 3/1997 | Ishihara | 395/184.01 |

*Primary Examiner*—Kevin J. Teska
*Assistant Examiner*—Tyrone V. Walker
*Attorney, Agent, or Firm*—Blakely, Sokoloff, Taylor & Zafman, LLP

[57] ABSTRACT

An emulation system is constituted with a plurality of FPGAs having on-chip integrated debugging facilities, distributively disposed on a plurality of circuit boards. Each FPGA's on-chip integrated debugging facilities include in particular, a scan register for outputting trace data, and comparison circuitry for generating inputs for a plurality of system triggers. Correspondingly, each board is provided with a plurality of trace memory for recording the trace data, and summing circuitry for generating partial sums for the triggers. The relative memory location within a clock cycle of trace data where the output of a LE will be recorded is predeterminable. Additionally, a system sync memory is provided for storing a plurality of sync patterns to facilitate reconstitution of trace data of a trace session. Lastly, the compilation or mapping software is enhanced to generate a cross-reference file cross referencing each circuit element in a circuit design to the predeterminable relative memory location within a clock cycle of trace data where the trace data for the particular circuit element can be found. Together, these elements allow fully visible tracing to be performed for an emulation.

21 Claims, 11 Drawing Sheets

TRACE XREF

| NODE ID | BYTE OFFSET | BIT OFFSET |
|---------|-------------|------------|
|         |             |            |

FIGURE 12

METHOD AND APPARATUS FOR PERFORMING FULLY VISIBLE TRACING OF AN EMULATION

BACKGROUND OF THE INVENTION

1. Field of the Invention

The present invention relates to the field of emulation systems. More specifically, the present invention relates to methods and apparatus for performing tracing of an emulation.

2. Background Information

Emulation systems for emulating circuit design are known in the art. Typically, prior art emulation systems are formed using conventional general purpose field programmable gate arrays (FPGAs). A circuit design to be emulated is "realized" on the emulation system by compiling a "formal" description of the circuit design, and mapping the circuit design onto the logic elements (LEs) of the FPGAs.

Conventional general purpose FPGAs, as far as their applications to emulation systems are concerned, have at least three disadvantages. First of all, the states of signals at the nodes mapped inside the FPGAs are not observable, thus the term "hidden" nodes. Secondly, in order to be able to observe the states of signals at these "hidden" nodes, reconfiguration, and therefore extremely time consuming recompilation is required to bring these signals outside the FPGAs to a logic analyzer. Thirdly, a number of FPGA I/Os have to be consumed for bringing these signals to the outside logic analyzer. Furthermore, the additional signals to be routed further increase signal routing congestion. Finally, for timing sensitive applications, it is difficult to know whether the signals at these "hidden" nodes were read at precisely the correct time or not, if the signals are to be read in response to the occurrence of certain events, since the signals have to be brought out of the FPGAs before the read triggering events can be detected.

Thus, it is desirable to have an emulation system and methodology for operating therein for performing fully visible tracing of an emulation. As will be described in more detail below, the present invention provides for such emulation system that achieves these and other desired results, which will be apparent to those skilled in the art from the description to follow.

SUMMARY OF THE INVENTION

An improved emulation system and methodology for operating therein for performing fully visible tracing is disclosed. The improved emulation system is constituted with a plurality of improved FPGAs having on-chip integrated debugging facilities, distributively disposed on a plurality of circuit boards[1] incorporated with the teachings of the present invention. More specifically, each FPGA's on-chip integrated debugging facilities include in particular, a scan register for outputting trace data for the LEs inside the FPGA, on a clock cycle by clock cycle basis, making the LEs fully visible from outside the FPGA, and comparison circuitry for generating trigger inputs for a number of system triggers in response to the detection of certain pre-stored data patterns.

[1] For the purpose of this application, the terms circuit boards and logic boards are synonymous.

Correspondingly, under the presently preferred embodiment, each circuit board is provided with a plurality of trace memory, one per FPGA, for recording the trace data output by the FPGAs, and summing circuitry, one per system trigger, for generating partial sums of the trigger inputs output by the FPGAs. The on-board trace memory is designed to facilitate recordation of trace data with a deterministic locality topology. In other words, the relative memory location within a clock cycle of trace data where the output of a LE of a particular FPGA will be recorded is predeterminable. Each circuit board is also provided with an address counter for generating addresses for the on-board trace memory.

Additionally, a number of system triggers are provided to generate a number of trigger signals using the partial sums output by the on-board summing circuitry, and a system synchronization memory is provided for synchronously recording sync patterns to facilitate recording of trace data in the on-board trace memory in a "wrap around" manner. A system address counter is also provided for generating addresses for the system synchronization memory. The compilation/mapping software is also enhanced to generate a cross-reference file of cross reference records cross referencing the circuit elements of a circuit design to be emulated to the predeterminable memory locations wherein the trace data for the circuit elements are to be found.

During compilation/mapping, the cross reference file is generated and saved. Then, during operation, the on-board address counters and the system address counter are reset each time a reset signal is asserted, such as at the beginning of an emulation. Upon detection of a monitored event by a trigger, signal state values of the LEs of the various FPGAs are caused to be scanned out and stored into the on-board trace memory. At the same time, sync patterns are synchronously stored into the system sync memory. During post processing, the sync patterns are used to reconstitute the trace data of a "trace session", whereas the cross reference records are used to retrieve trace data of specific circuit elements.

BRIEF DESCRIPTION OF DRAWINGS

The present invention will be described by way of exemplary embodiments, but not limitations, illustrated in the accompanying drawings in which like references denote similar elements, and in which:

FIG. 12 illustrates one embodiment of the cross reference file of FIG. 11.

DETAILED DESCRIPTION OF THE INVENTION

In the following description, for purposes of explanation, specific numbers, materials and configurations are set forth in order to provide a thorough understanding of the present invention. However, it will be apparent to one skilled in the art that the present invention may be practiced without the specific details. In other instances, well known features are omitted or simplified in order not to obscure the present invention.

Figure 1:
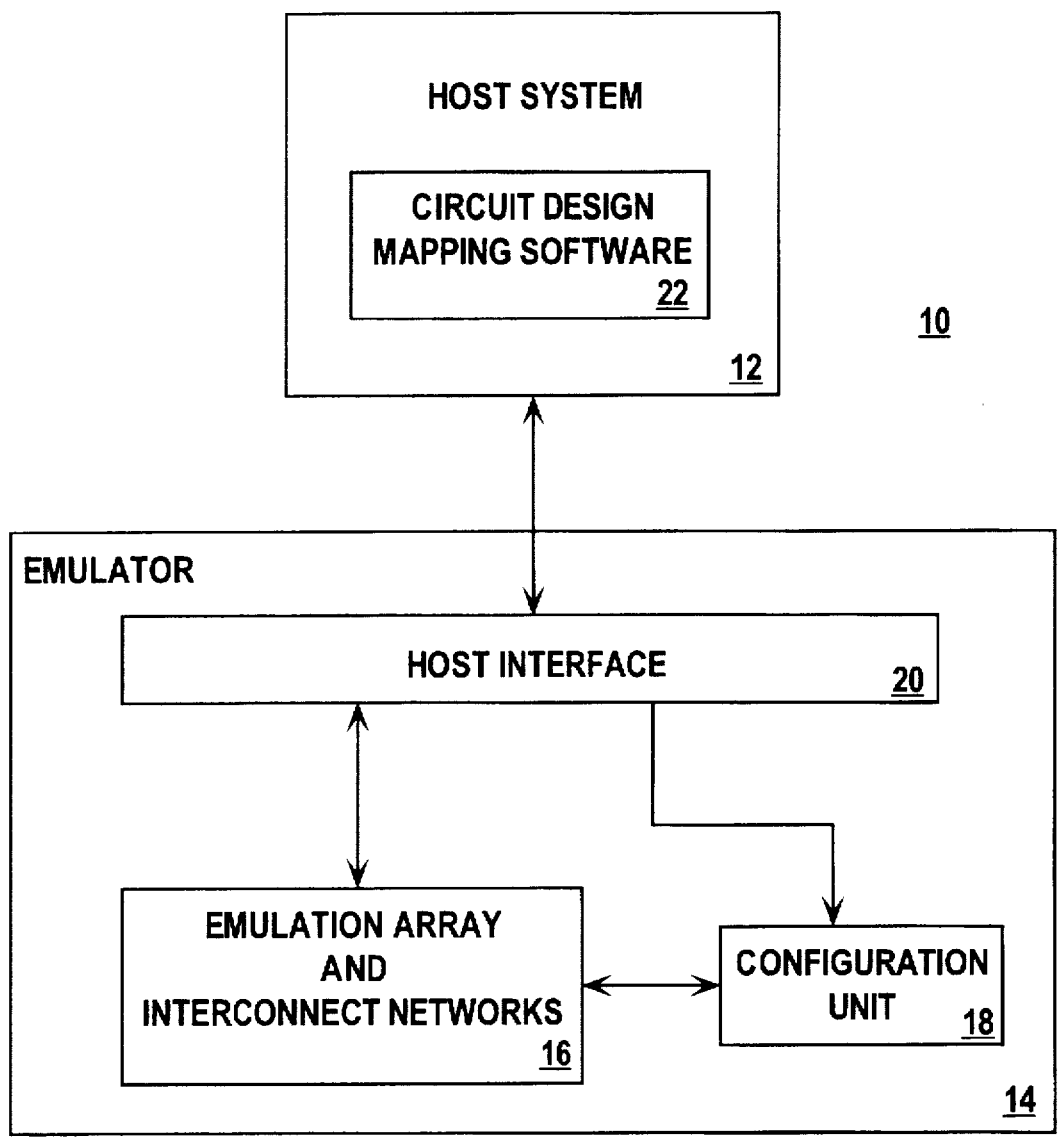
FIG. 1 illustrates an exemplary emulation system incorporated with the teachings of the present invention.

Referring now to FIG. 1, an emulation system 10 incorporated with the teachings of the present invention is shown. As illustrated, emulation system 10 includes host system 12 and emulator 14. Host system 10 includes in particular enhanced circuit design compilation/mapping software 22. Circuit design compilation/mapping software 22 are stored in suitable storage medium (not shown) of host system 10, and loaded into memory (not shown) of host system 10 for execution by one or more processors (not shown) of host system 10. Except for the enhancement provided to circuit design compilation/mapping software 22, host system 10 including circuit design compilation/mapping software 22 is intended to represent a broad category of host systems and their software found in conventional emulation systems, thus will not be otherwise further described.

Emulator 14 includes emulation array and interconnecting networks 16 incorporated with the teachings of the present invention, configuration unit 18 and host interface 20 coupled to each other as shown. Except for emulation array and interconnecting network 16, configuration unit 18 and host interface 20 are also intended to represent a broad category of these elements found in conventional emulators, whose functions and constitutions are also well known, and therefore will not be further described either.

Figure 2:
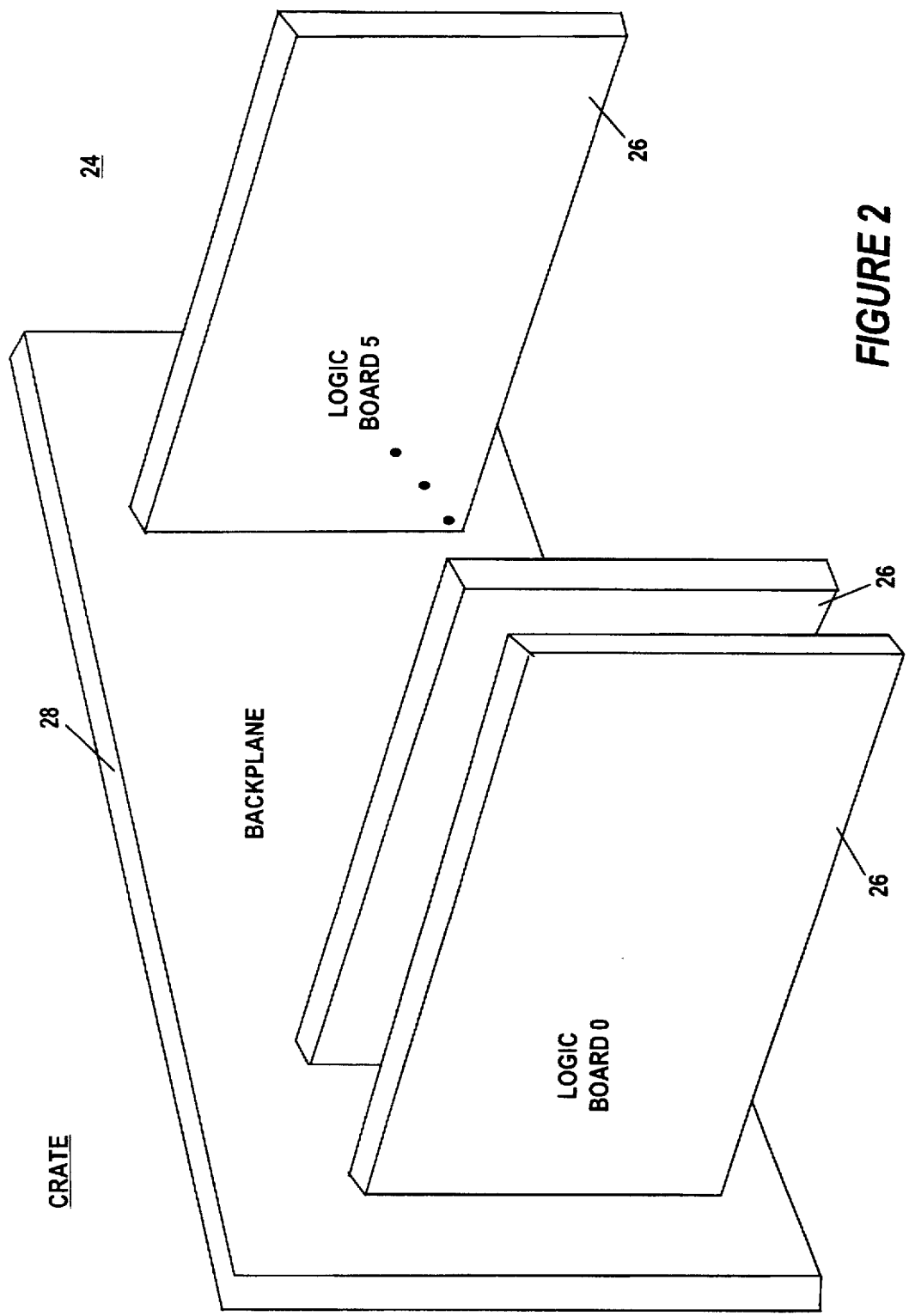
FIG. 2 is a physical view of one embodiment of the emulator of FIG. 1.

Referring now to FIG. 2, wherein a physical view of one embodiment of emulation array and interconnect networks 16 is shown. For the illustrated embodiment, emulation array and interconnect networks 16 is distributively disposed on a plurality of logic boards 26. Logic boards 26 are electrically connected to each other through backplane 28. Together, logic boards 26 and backplane 28 are packaged in crate 24. Before we proceed to describe logic boards 26 and backplane 28 in further detail, it should be noted that while for ease of explanation, the present invention is being described with a single crate embodiment, based on the description to follow, a person skilled in the art will appreciate that the present invention may be practiced in any number of form factors comprising any number of "crates" with each "crate" having any number of "logic boards" directly connected to each other or indirectly connected to each other via one or more "backplanes".

Figure 3:
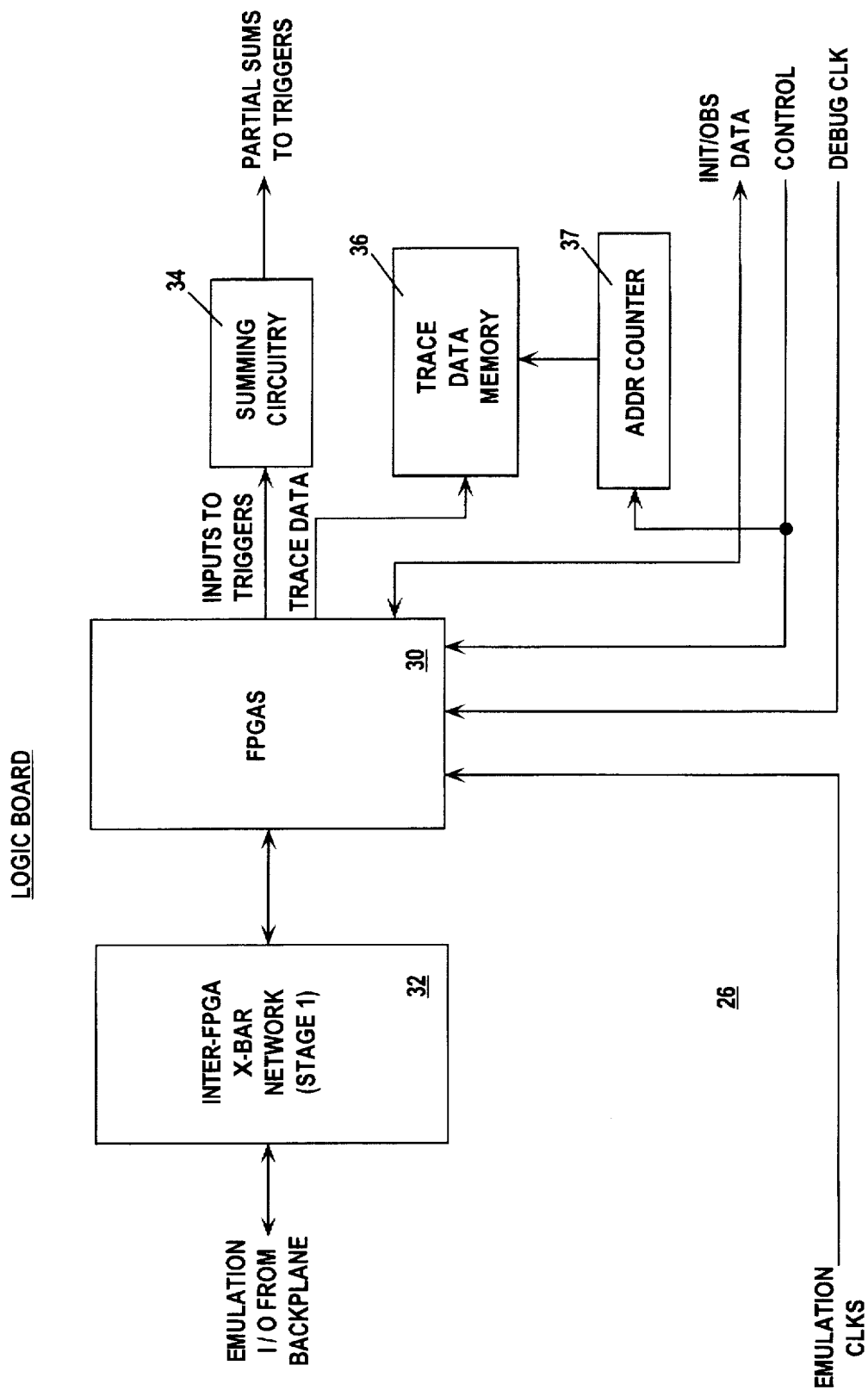
FIG. 3 illustrates one embodiment of the logic board of FIG. 2.

FIG. 3 illustrates one embodiment of logic board 26. As shown, for the illustrated embodiment, each logic board 26 comprises a plurality of FPGAs 30 for "realizing" the circuit elements of a circuit design. In other words, FPGAs 30 of emulation array 16 are distributively disposed on one or more logic boards 26. Additionally, each logic board 26 further comprises inter-FPGA crossbar (or x-bar) network (stage 1) 32 coupled to FPGAs 30 for interconnecting FPGAs 30 on the various logic boards 26 to each other and to host system 12. Furthermore, logic board 26 comprises trace data memory 36, and summing circuitry 34, both coupled to FPGAs 30, for capturing and storing fully visible LE trace data of FPGAs 30 and generating partial sums for trigger inputs output by FPGA 30. Logic boards 26 is also provided with address counter 37 for generating addresses for trace data memory 36.

In accordance to the present invention, each FPGA of FPGAs 30 is to include on-chip integrated debugging facilities. In particular, each FPGA is to include a first integrated debugging facility for outputting fully visible trace data of all its LEs, on a clock cycle by clock basis, and a second integrated debugging facility for outputting inputs for a plurality of system triggers. A particular example of a FPGA having such on-chip integrated debugging facilities is disclosed in copending U.S. Application, A/N: 08/542,838, entitled "A FPGA having on-chip integrated debugging facility", having common inventorship and assignee with the present invention, and filed contemporaneously with this application, which is hereby fully incorporated by reference. Nevertheless, we will briefly describe the FPGA disclosed in the copending application further below.

Inter-FPGA crossbar network (stage 1) 32 comprises a plurality of programmable electrical signal switching paths. Inter-FPGA crossbar network (stage 1) 32, also functionally "doubles" as inter-board crossbar network (stage 0) for interconnecting logic boards 26, to be described more fully below. A particular example of inter-FPGA cross network (stage 1) 32 is disclosed in copending U.S. Application, A/N: 08/542,519, now U.S. Pat. No. 5,574,388, "An Emulation System Employing A Multi-Level Multi-Stage Network Topology For Interconnecting Reconfigurable Logic Elements", also having common inventorship and assignee with the present invention, and filed contemporaneously with this application, which is hereby fully incorporated by reference. Nevertheless, inter-FPGA crossbar network (stage 1) 32 disclosed in the copending application will also be briefly described below.

On-board trace data memory 36 in accordance to the present invention facilitates capturing and storing trace data output by FPGAs 30, i.e., signal state values of the LEs of FPGAs 30, with a deterministic locality topology. In other words, the relative memory location within a clock cycle of trace data where the output of a LE of a particular FPGA is to be recorded is pre-determinable. Trace data memory 36 is advantageously placed on-board close to FPGAs 30 to ensure all signal state values of all LEs of a FPGA can be captured and stored within a clock cycle of an emulation clock (without having to slow down the emulation clock[2] to accomplish the clock cycle by clock cycle objective). In the presently preferred embodiment, one trace data memory unit is provided for each FPGA. The trace data memory units 36 and the FPGAs 30 are correspondingly coupled to each other. Moreover, fast dual ported video random access memory (RAM) are used for trace data memory 36 to further facilitate achieving the objective of being able to capture and store the trace data of all LEs on a clock cycle by clock cycle basis.

[2] In many emulations, the option of "slowing down" the emulation clock is not even available, since the design is to be emulated in the target operating speed.

On-board address counter 37 is provided for generating addresses for on-board trace memory 36. On-board address counter 37 is incremented using the same scan clock employed for scanning out the trace data of all LEs of FPGAs 30, on a clock cycle by clock cycle basis, to be more fully described below. While functionally, one "global" address counter is sufficient, however, one address counter 37 per logic board 26 is preferred, in order to eliminate having to route the trace memory addresses to each logic board 26, thereby reducing the pin out requirements on each logic board 26.

On-board summing circuitry 34 comprises a plurality of partial sum circuits. In the presently preferred embodiment, one summing circuit is provided for each system trigger, and all FPGAs 30 are coupled to each of the summing circuits 34.

Trace data memory 36 and summing circuitry 34 will be described in more detail below with references to the additional figures. However, we will first briefly describe the FPGA and the relevant aspect of interconnecting FPGAs disclosed in copending applications A/N 08/542,838 and A/N 08/542,519, now U.S. Pat. No. 5,574,388 identified above.

Figure 4A:
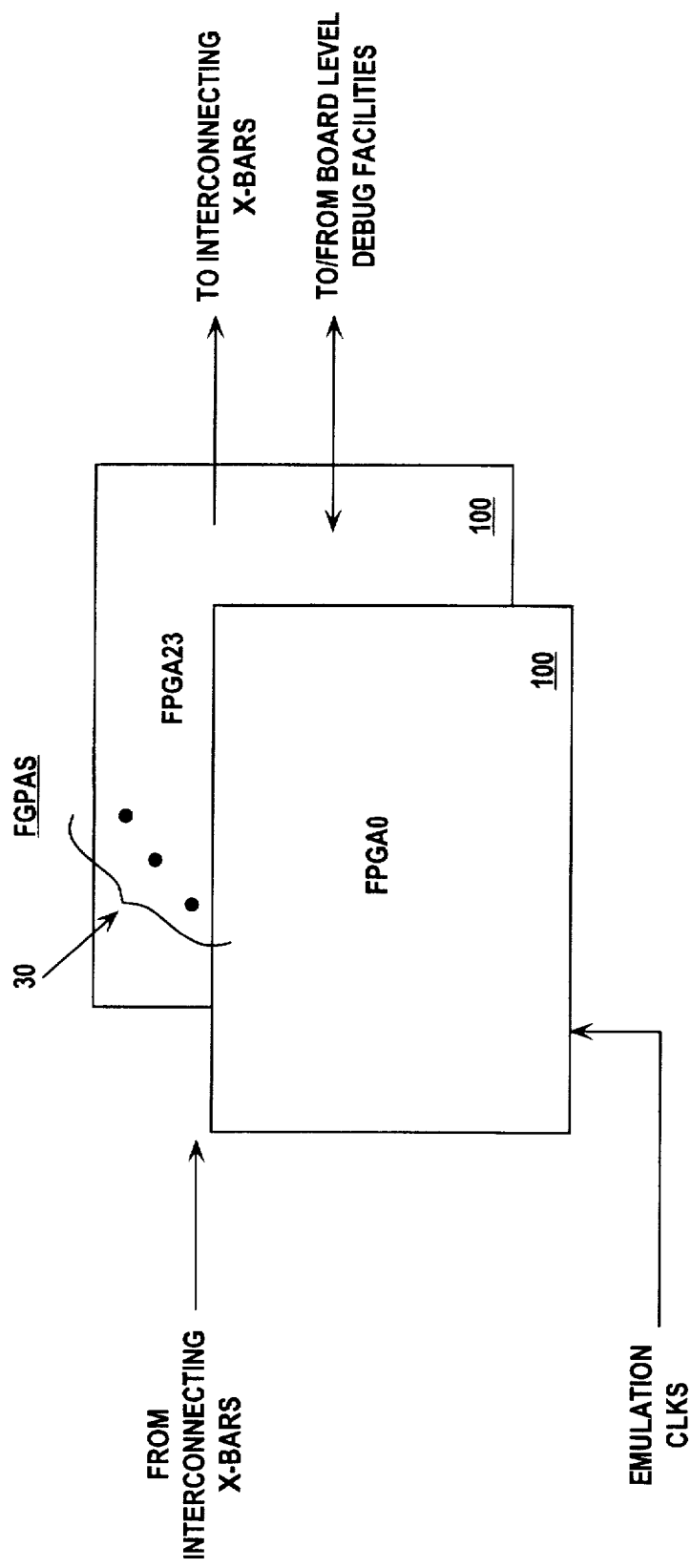
FIGS. 4a–4b illustrate one embodiment of the FPGA array of FIG. 3.
Figure 4B:
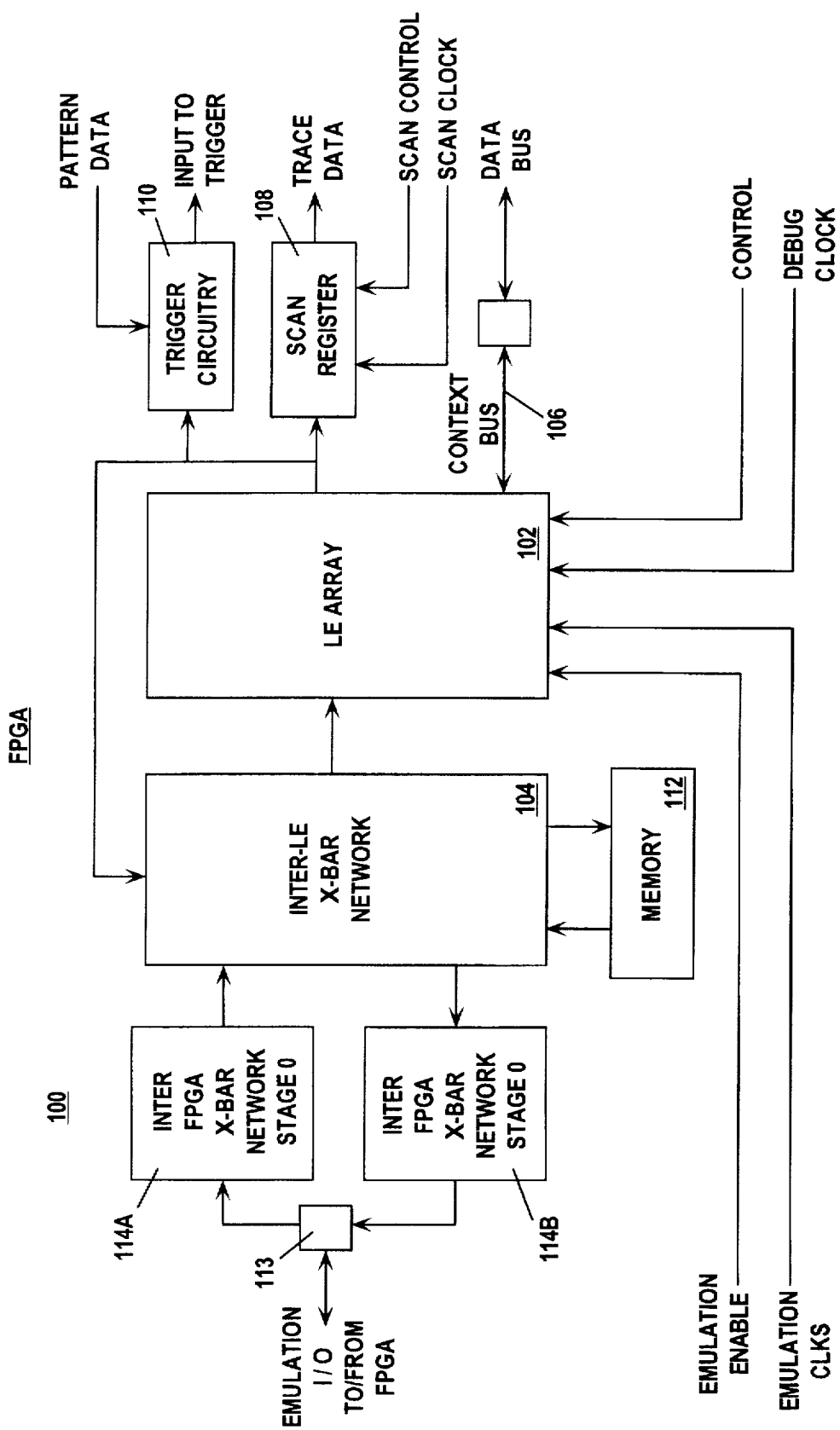

FIGS. 4a-4b illustrate one embodiment of FPGAs 30 disclosed in the copending application. As shown, for the illustrated embodiment, FPGAs 30 comprise 24 FPGAs with on-chip integrated debugging facilities 100. FPGA 100 comprises an array 102 of enhanced LEs, which are used to "realize" various elements of circuit designs. Additionally, FPGA 100 further includes context bus 106, scan register 108 and trigger circuitry 110, coupled to the enhanced LEs as shown. Context bus 106 is used for inputting and outputting values to and from the LEs. Scan register 108 is used to output trace data of all LEs of a FPGA in one clock cycle of an emulation clock, whereas trigger circuitry 110 is used to generate a number of trigger inputs in response to the detection of a number of stored data patterns.

For the illustrated embodiment, FPGA 100 further includes memory 112 to facilitate usage of FPGA 100 for emulating circuit designs with memory. Pins 113 of FPGA 100 can be preconfigured for either input or output. FPGA 100 also includes inter-LE crossbar network 104 for interconnecting the LEs 102, memory 112, and I/O pins 113, as shown. Finally, FPGA 100 also include the inter-FPGA crossbar network (stage 0) 114 for inter-connecting FPGA 100 to other FPGAs. Inter-FPGA cross-bar network (stage 0) 114 at the chip-level "mates" with inter-FPGA cross-bar network (stage 1) 32 at the board level. For further description of FPGA 100, refer to the incorporated by reference copending application A/N 08/542,838 identified above.

Figure 5:
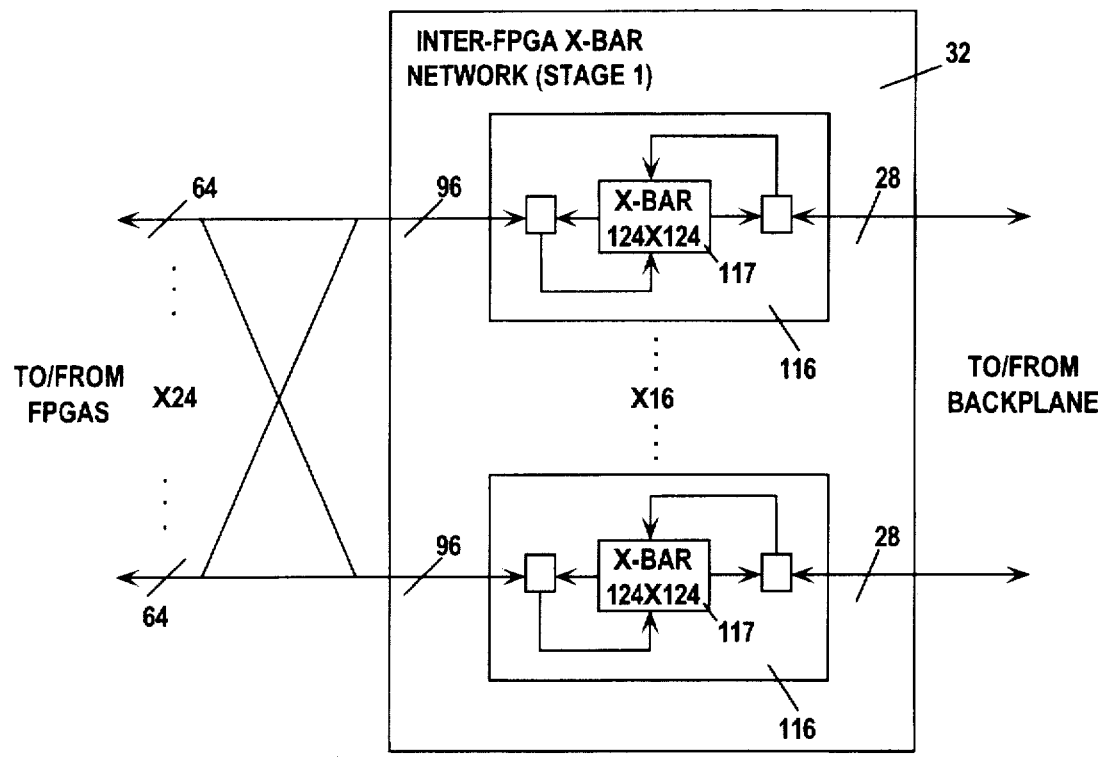
FIG. 5 illustrates one embodiment of the inter-FPGA crossbar network (stage 1) of FIG. 3.

FIG. 5 illustrates one embodiment of inter-FPGA crossbar network (stage 1) 32 disclosed in the above identified copending application. As shown, for the illustrated embodiment, inter-FPGA crossbar network (stage 1) 32 comprises 16 routing chips 116 for coupling 64 I/O signals from each of 24 FPGAs 30 to the next stage of a Claus network for interconnecting the FPGAs to each other. In other words, full cross switching between the 64 I/O pins of each FPGA and the 448 I/O pins of logic board 26 is provided. Each of routing chips 116 comprises a 124×124 crossbar 117 to facilitate routing of 96 signals to/from FPGA 30 and 28 signal to/from backplane 28. For further description of inter-FPGA crossbar network, also refer to the incorporated by reference copending application A/N 08/542,519, now U.S. Pat. No. 5,574,399 identified above.

Figure 6:
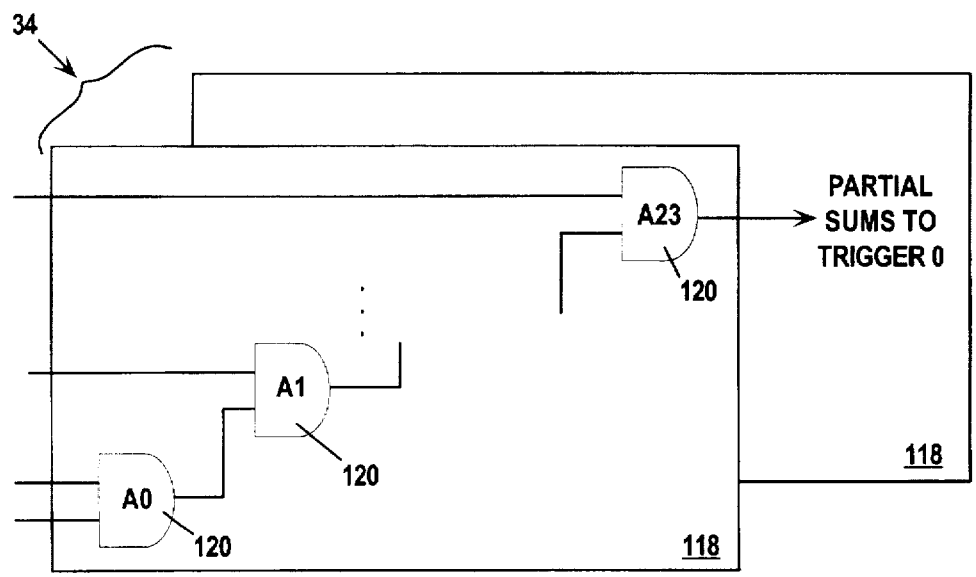
FIG. 6 illustrates one embodiment of the on-board summing circuitry of FIG. 3.

Referring now to FIG. 6, wherein one embodiment of on-board summing circuitry 34 is illustrated. As shown, for the illustrated embodiment, on-board summing circuitry 34 comprises four sets of AND gates 118. In other words, for the illustrated embodiment, partial sum inputs are generated for 4 system triggers. Each set 118 comprises 24 AND gates, serially coupled to each other and corresponding coupled to 24 FPGAs 30. Each set 118 receives the trigger inputs output by the corresponding FPGAs 30 and in response, the received inputs are incrementally aggregated to generate a partial sum input for all 24 FPGAs 30 for a system trigger. The system trigger may be used for a variety of purposes, including in particular, the starting of trace data collection.

Figure 7:
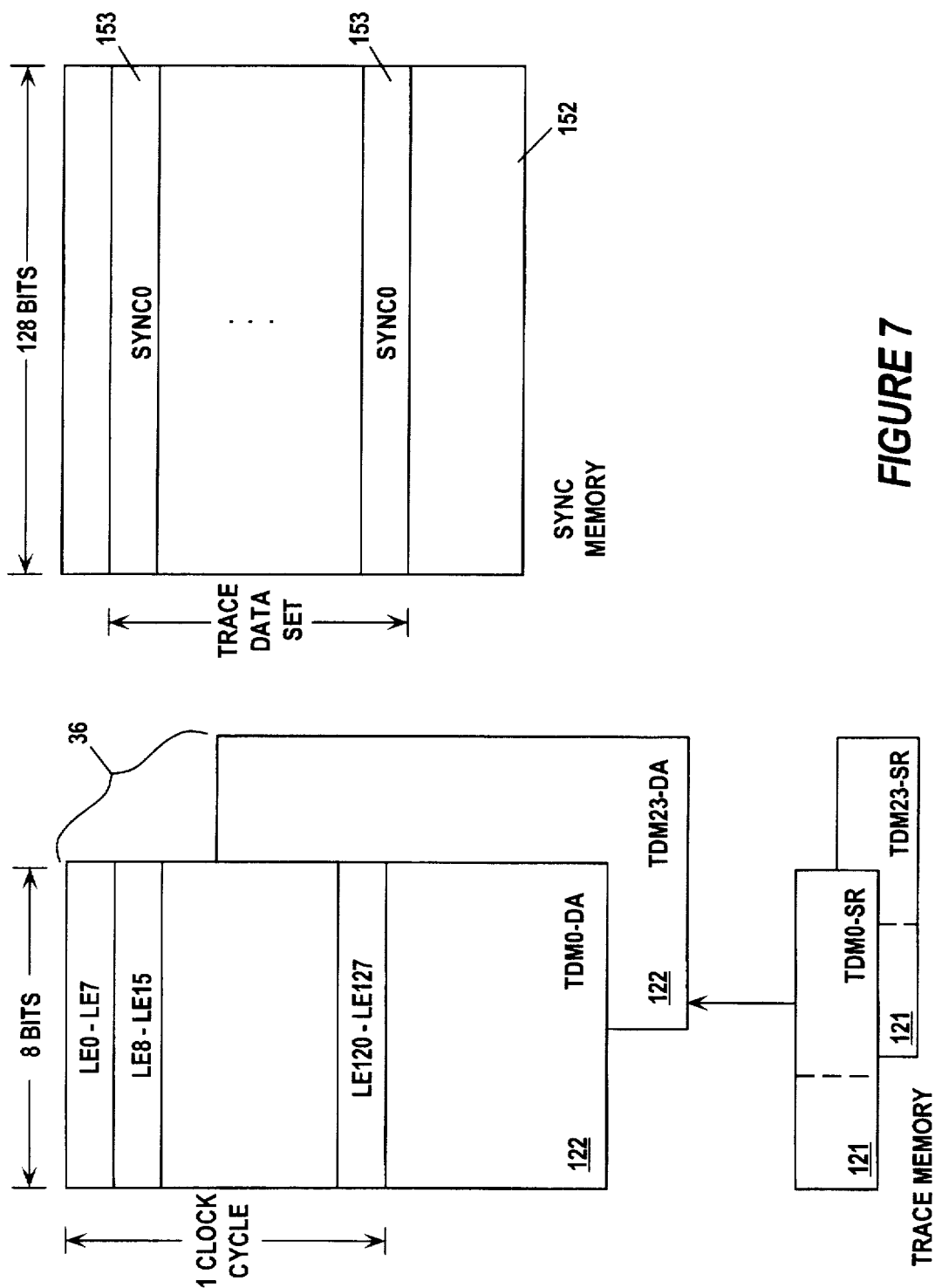
FIG. 7 illustrates one embodiment of the on-board trace memory of FIG. 3, and system sync memory of FIG. 8.

Referring now to FIG. 7, wherein one embodiment of on-board trace memory 36 is illustrated. FIG. 7 also illustrates system sync memory 152 whose description will be deferred until backplane 28 has been described. As shown, for the illustrated embodiment, trace memory 36 comprises 24 memory units, i.e. one per FPGA of FPGAs 30. As described earlier, each memory unit is preferably implemented using fast dual-port video RAM comprising a RAM array portion 122, and a shift register portion 121. Preferably, each half of shift register 121 can be operated on independently of the other half, allowing the two halves to be independently loaded into the corresponding RAM array 122 as soon as it is filled, without having to wait for the filling of the other half to be completed. For the illustrated embodiment, on-board trace memory unit 122 is 8-bit wide. Thus, for an embodiment wherein the FPGA comprises 128 LEs, 16 bytes (16×8=128) are used to store the trace data output by a FPGA per clock cycle. Therefore, the precise memory location where the trace data of a LE will be written in trace memory 36 is predeterminable. As a result, once the decision is made as to the mapping of a particular circuit element of a circuit design to be emulated, the relative memory location within a clock cycle of trace data where the output of the particular circuit will be written is known.

Under the presently preferred embodiment, trace data are stored in trace memory 36 from "top" to the "bottom". Once the "bottom" of trace memory 36 is reached, storage of trace data starts from the "top" again. In other words, trace memory 36 is accessed as a "wrap around" buffer. As will be described in more detail below, sync patterns synchronously stored in a system sync memory 152 is used to reconstitute the trace data of a "trace session" during post processing.

Figure 8:
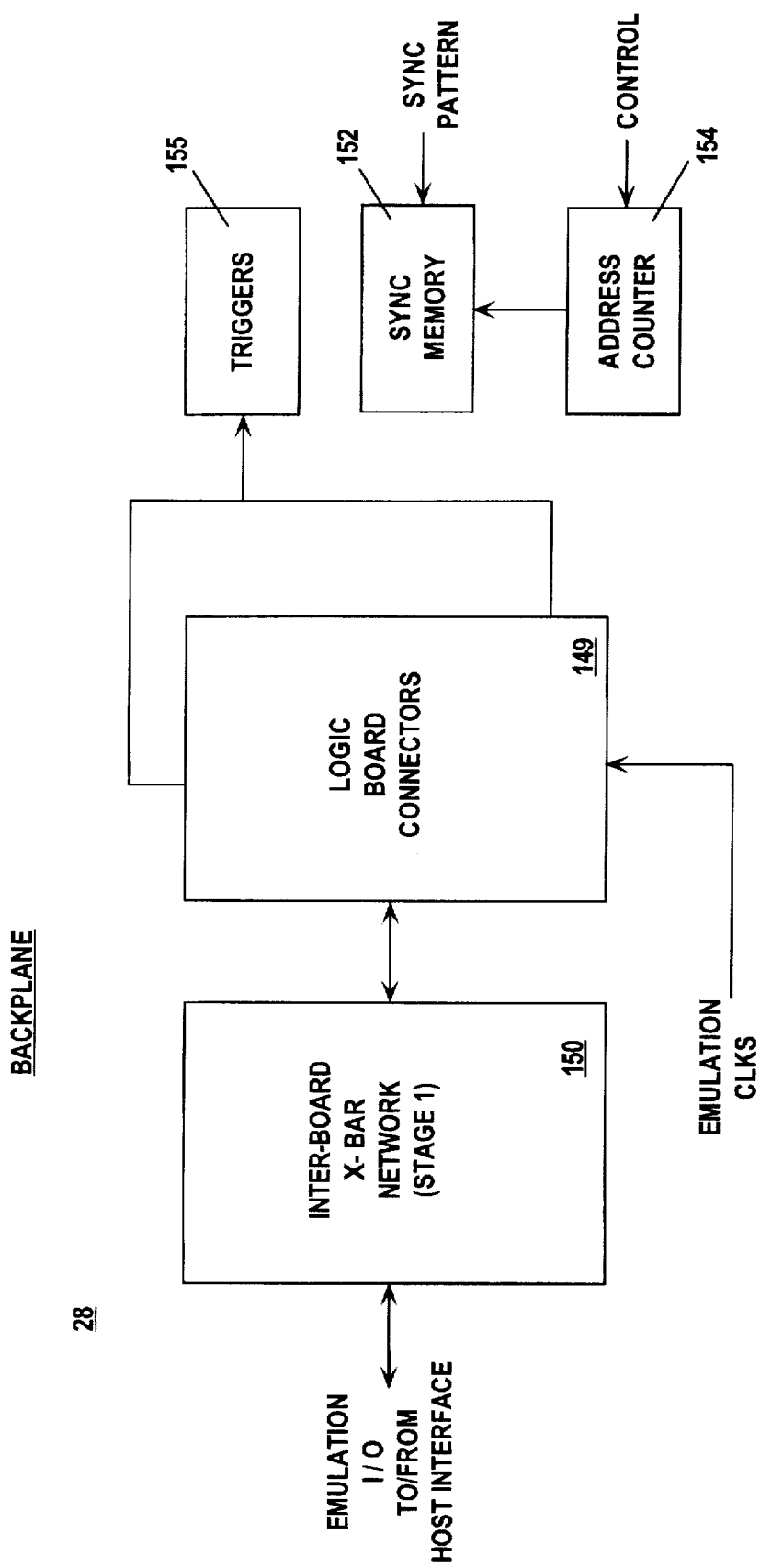
FIG. 8 illustrates one embodiment of the backplane of FIG. 2.

Having now described the major components at the board level. We now proceed to describe how the boards are electrically coupled to each together. Recall from FIG. 2 that multiple logic boards 26 are physically and electrically coupled to backplane 28 to form crate 24. FIG. 8 illustrates one embodiment of backplane 28. In addition to logic board connectors 149 for receiving logic boards 26, backplane 28 further comprises inter-board crossbar network (stage 1) 150 for electrically interconnecting logic boards 26. Functionally, inter-board crossbar network (stage 1) 150 can also be considered as inter-FPGA crossbar network (stage 2). (For multi-crate embodiments, it also "doubles" as inter-crate crossbar network stage 0.)

Figure 9:
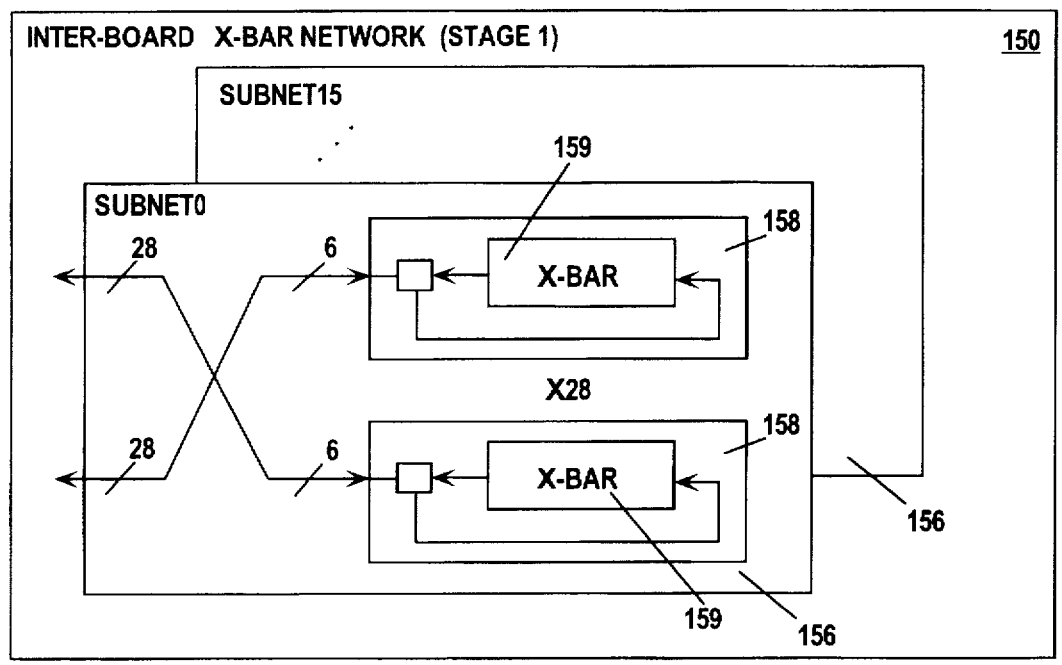
FIG. 9 illustrates one embodiment of the inter-board crossbar network (stage 1) of FIG. 8.

FIG. 9 illustrates one embodiment of inter-board crossbar network (stage 1) 150. As shown, for the illustrated embodiment, inter-board crossbar network (stage 1) 150 comprises 16 subnets, subnet0 through subnet15 156. Each subnet 156 comprises 28 routing chips 156 for interconnecting 6 sets of 28 signals output by FPGAs 30 at the board level in a "butterfly" manner, one set per logic board 26. Each routing chips 156 comprises a 6×6 crossbar 159 for providing routing of 6 signals to/from logic boards 26³. In other words, only the outputs of the correspondingly disposed routing chips 116 in inter-FPGA crossbar network (stage 1) 32 on various logic boards 26 are interconnected together. For examples, the "first" routing chip 116 in inter-FPGA crossbar network (stage 1) 32 on the six logic boards 26 are interconnected together, the "second" routing chip 116 in inter-FPGA crossbar network (stage 1) 32 on the six logic boards 26 are interconnected together, and so forth. For further description of inter-board connection (as well as inter-crate connection), refer to the incorporated by reference copending application A/N 08/542,519, now U.S. Pat. No. 5,574,388 identified above.

³ Some or all of routing chips 158 may be combined together, in particular, for "larger" embodiments.

Referring back to FIG. 8, backplane 28 further comprises a number of system triggers 155, system sync memory 152, and system address counter 154. Each system trigger 155 receives a partial sum output from each of logic boards 26, and in response, triggers a global signal if the at least one of the received partial sums is in a desired state. As described earlier, sync memory 152 is used to synchronously store sync patterns as trace data are output from FPGAs 30 and stored into on-board trace memory 36. System address counter 154 is used to generate addresses for sync memory 152. Address counter 154 is incremented proportionally using the same scan clock for scanning out trace data and incrementing on-board address counters 37 described earlier. For example, in one embodiment, system address counter 154 is incremented once for each clock cycle, while on-board address counters 37 are incremented 16 times for each clock cycle. While triggers 155, sync memory 152 and address counter 154 are being described as disposed on backplane 28, as will be appreciated by those skilled in the art, they may be disposed in a number of alternative locations, for example, a common control or service board.

Figure 10:
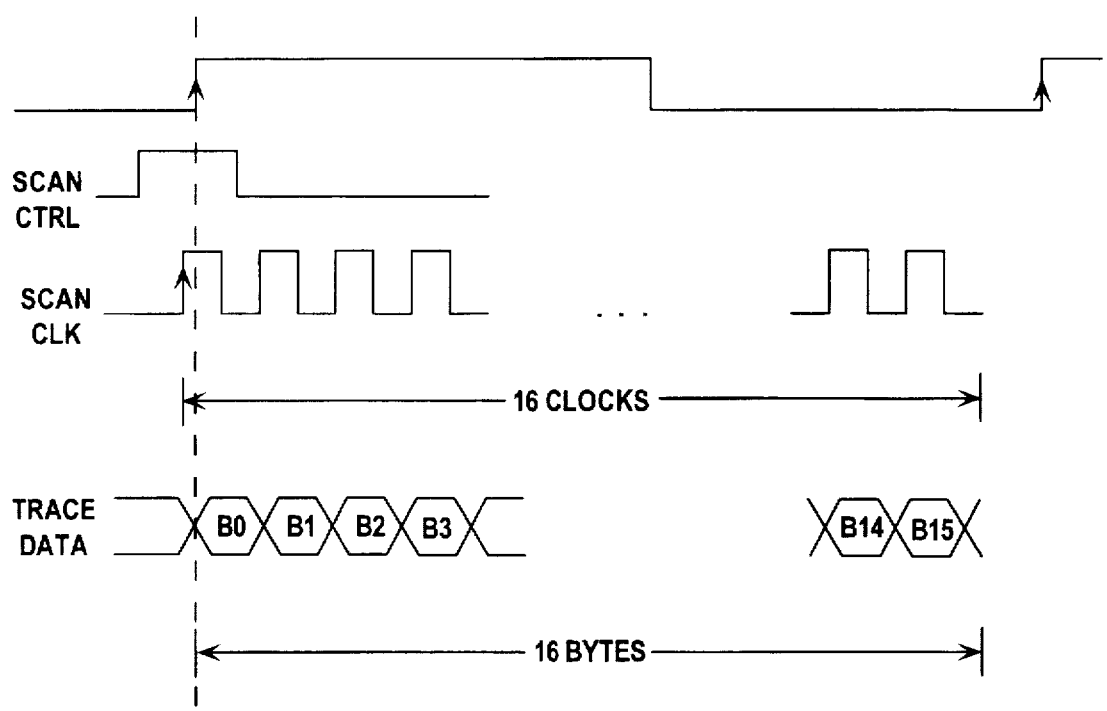
FIG. 10 is an exemplary timing diagram illustrating the manner in which trace data of the LEs of a FPGA are caused to be output.

Before describing system sync memory 152 more fully, refer now briefly to FIG. 10, wherein an exemplary timing diagram for causing trace data to be scanned out of LE array 102 of FPGA 100 is shown. As shown, at the rising edge of the current operating emulation clock, a scan control signal and a number of scan clock pulses are provided by host system 10 to scan register 108 causing scan register 108 to serially scan out the current values of the LEs of LE array 102. If trace data are collected in response to the detection of certain events, the scan control signal and scan clock pulses are provided in response to the trigger signals generated as a result of the detection of prestored data patterns representing the events. The number of clock pulses to be provided are determined by the number of internal elements of scan register 108. In an embodiment where scan register 108 comprises 16 sets of 8 flip-flops with each set responsible for 8 LEs, 16 clock signals are provided as shown. The required clock pulses are provided in-between two rising edges of the operating emulation clock, to ensure all LE trace data are scanned out within one clock cycle, thereby allowing fully visible LE trace data to be captured in a clock cycle by clock cycle basis. In response, as illustrated, for the 16 flip-flop set embodiment, 16 bytes of trace data are written into the trace memory unit of trace memory 36 corresponding to the particular FPGA 100.

Referring now to FIG. 7 again, as the trace data are scanned out of FPGAs 30, the trace data are shifted into the corresponding shift registers 121 of trace memory 36. Whenever the left or right halves of shift registers 121 are filled, the stored trace data are stored into the corresponding memory locations of trace memory 36 denoted by on-board address counter 37. Concurrently, a sync pattern 153 is stored into a corresponding memory location of system sync memory 152 denoted by system address counter 154. In one embodiment, sync pattern 153 is the same size as one clock cycle for trace data, e.g. 128 bits for the 128 LE FPGA embodiment. The same sync pattern is used for all trace data collected in a "trace session". Thus, during post processing, starting at memory locations in all on-board trace memory 36 corresponding to where address counter 154 stopped, the trace data of a "trace session" can be reconstituted by reading proportionally "backward" in all on-board trace memory 36, as long as corresponding "backward" reading of sync patterns 153 stored in sync memory 152 remain unchanged.

Figure 11:
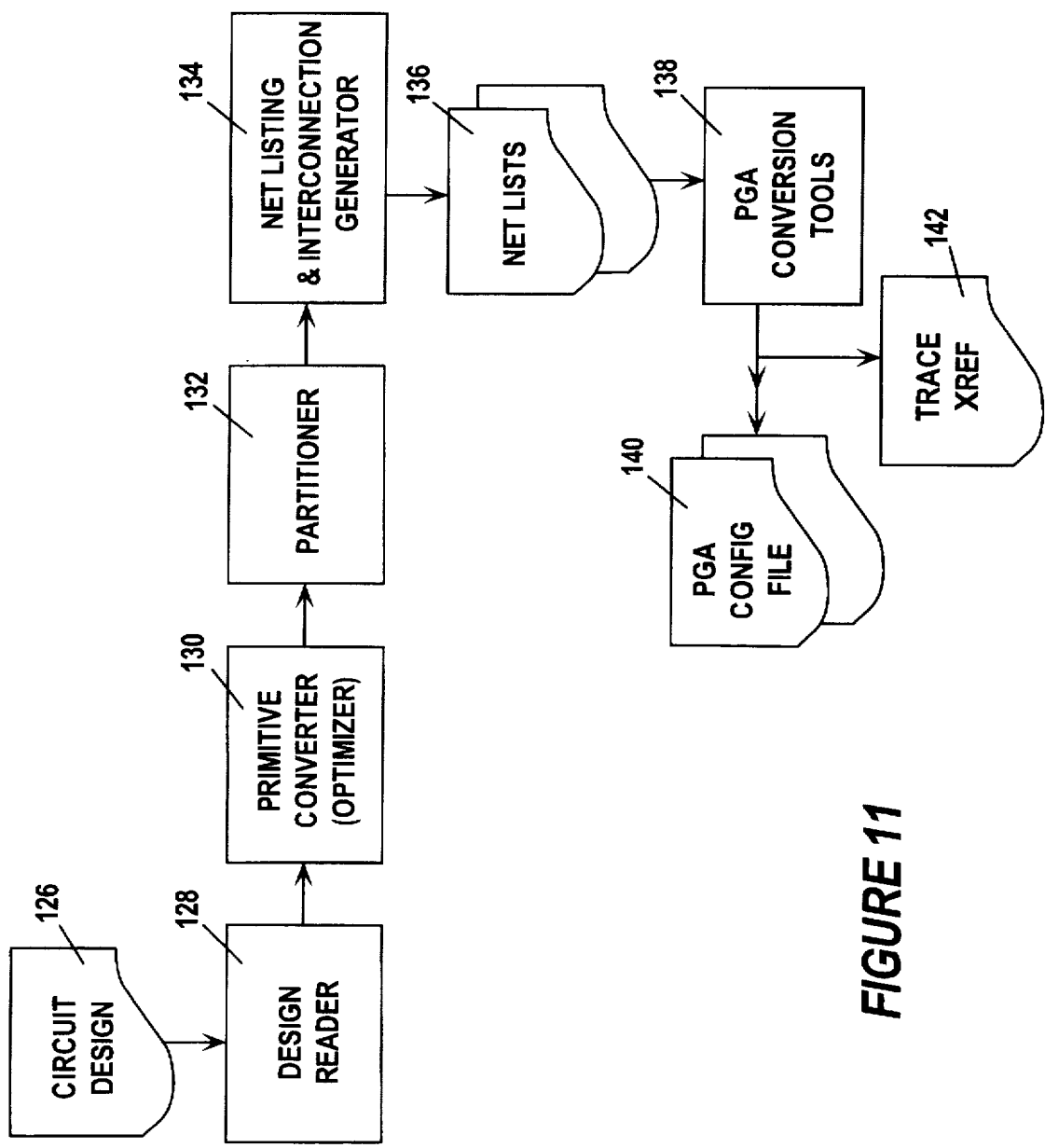
FIG. 11 illustrates one embodiment of the circuit design compilation/mapping software of FIG. 1.

Having now described the operating method for collecting the fully visible trace data, and the manner in which the trace data of a "trace session" can be reconstituted, we now proceed to describe how the trace data can be correlated with the various circuit elements of the circuit design being emulated. Recall from earlier description, host system 12 includes circuit design compilation/mapping software (see FIG. 1) for compiling and mapping the circuit design to the LEs of FPGAs 30, and the memory locations where the state values of the LEs will be written are predeterminable (see FIG. 7). FIG. 11 illustrates one embodiment of circuit design compilation/mapping software 22 enhanced to leverage the deterministic characteristic of the LE trace data storage locations. As shown, circuit design compilation/mapping software 22 comprises design reader 128, primitive converter 130, partitioner 132, and net listing and interconnection generator 134 for reading, interpreting, optimizing, and partitioning circuit design 124 into net lists 136. Circuit design compilation/mapping software 22 further comprises PGA configuration tools 138 for converting net lists 136 into PGA conversion files 140, which are then used to configure emulator 14 to "realize" circuit design 126 on emulator 14. Additionally, in accordance with the present invention, PGA conversion tools 138 are enhanced to also generate cross reference file 142 for cross referencing circuit elements of circuit design 126 to memory locations of trace memory 36.

Except for the generation of cross reference file 142, design reader 128, primitive converter 130 etc. of circuit design compilation/mapping software 22 are intended to represent a broad category of these software tools found in conventional emulation systems, thus will not be further described.

FIG. 12 illustrates one embodiment of cross reference file 142. As shown, cross reference file 142 comprises cross reference records 146 for circuit elements of circuit design 126. Each cross reference record 146 comprises a node identifier 148 identifying the circuit element, a byte offset 150 identifying the offset location into each group of trace data (for a clock cycle) where the trace data for the particular circuit element is to be found, and a bit offset 152 identifying the offset location into the identified byte position where the trace data for the particular circuit element is located.

Thus, when an emulator system is equipped with FPGA having on-chip integrated facilities, which in turn are complemented with trace memory with the above described deterministic characteristics, fully visible tracing may be performed employing the cross references and sync patterns as described above. Therefore, a method and apparatus for performing fully visible tracing of an emulation has been described.

While the method and apparatus of the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. An apparatus comprising:

a plurality of field programmable gate arrays (FPGAs) for emulating at least a subset of a circuit design, each field programmable gate array being a single integrated circuit comprising both a plurality of logic elements (LEs) for realizing circuit elements of the at least a subset of the circuit design and a first on-chip integrated debugging facility for outputting signal state values of the LEs on a clock cycle by clock cycle basis; and trace memory coupled to the FPGAs comprising a plurality of memory locations for capturing and storing the LE signal state values output in a deterministic locality topology, under which the relative memory location within a clock cycle of trace data where the signal state value of a circuit element is stored is predeterminable.

2. The apparatus as set forth in claim 1, wherein the trace memory comprises a plurality of trace memory units correspondingly coupled to the FPGAs, each trace memory unit comprises memory locations for storing N clock cycles of LE signal state values, and the signal state value of a LE is stored in a predetermined fixed offset into each block of memory locations used for storing a clock cycle of LE signal state values.

3. The apparatus as set forth in claim 1, wherein the apparatus further comprises an address counter coupled to the trace memory units for generating addresses for the trace memory units in a manner coordinated with the outputting of the LE signal state values.

4. The apparatus as set forth in claim 1, wherein each FPGA further comprises a second on-chip integrated debugging facility for outputting the LE signal state values as inputs to at least one trigger; and the apparatus further comprises at least one summing circuit coupled to the FPGAs for generating a partial sum of the LE signal state values for each of the at least one trigger.

5. An apparatus comprising:

a plurality of field programmable gate arrays (FPGAs) for emulating a circuit design, each field programmable gate array being a single integrated circuit comprising both a plurality of combinatorial logic blocks (LEs) for realizing circuit elements of the circuit design and a first on-chip integrated debugging facility for outputting signal state values of the LEs on a clock cycle by clock cycle basis; and trace memory coupled to the FPGAs comprising a plurality of memory locations for capturing and storing the LE signal state values output in a deterministic locality topology, under which the relative memory location within a clock cycle of LE signal state values where the signal state value of a particular LE is stored is predeterminable.

6. The apparatus as set forth in claim 5, wherein, the FPGAs are distributively disposed in a plurality of logic boards, and the trace memory comprises a plurality of trace memory units correspondingly coupled to the FPGAs, one trace memory unit per FPGA, and disposed on the same logic board with the coupled FPGA.

7. The apparatus as set forth in claim 6, wherein each trace memory unit comprises memory locations for storing N clock cycles of LE signal state values, and the signal state value of a LE is stored in a predetermined fixed offset into each block of memory locations for storing a clock cycle of LE signal state values.

8. The apparatus as set forth in claim 7, wherein the apparatus further comprises a plurality of address counters correspondingly disposed on the logic boards and coupled to the trace memory units of the same logic board for locally generating addresses for the local trace memory units in a manner coordinated with the outputting of the LE signal state values.

9. The apparatus as set forth in claim 7, wherein the trace data are stored into the trace memory units in a wrap around manner, and the apparatus further comprises a system sync memory for synchronously storing sync patterns to be used in post processing to reconstitute trace data of a trace session.

10. The apparatus as set forth in claim 5, wherein each FPGA further comprises a second on-chip integrated debugging facility for outputting the LE state values as input to at least one trigger; and the apparatus further comprises summing circuitry for generating at least one sum of the LE signal state values for at least one trigger.

11. The apparatus as set forth in claim 10, wherein the FPGAs are distributively disposed in a plurality of logic boards, the summing circuitry comprises a plurality of at least one partial sum circuit distributively disposed on the logic boards and coupled to the FPGAs on the same logic board for generating a plurality of partial sums of the LE signal state values for the at least one trigger.

12. In an emulation system, a method for performing fully visible tracing of an emulation, the method comprising the steps of:

a) outputting signal state values for all logic elements (LEs) of each field programmable gate array (FPGA) of the emulation system used for emulating a circuit design;

b) capturing and storing the LE signal state values output into memory locations of a trace memory in a deterministic locality topology, under which the relative memory location within a block of memory locations used for storing a clock cycle of signal state values where the signal state value of a LE is stored is predeterminable.

13. The method as set forth in claim 12, wherein the FPGAs are distributively disposed in a plurality of logic boards, and step (b) comprises capturing and storing the LE signal state values output in a plurality of trace memory units correspondingly coupled to the FPGAs and disposed in the same logic board as the coupled FPGA.

14. The method as set forth in claim 13, wherein step (b) further comprises generating trace memory addresses on each logic board locally and providing the locally generated trace memory addresses to the trace memory units of the corresponding logic boards.

15. The method as set forth in claim 13, wherein step (b) further comprises storing the signal state value of a LE in the same relative offset location within a block of memory locations used for storing the LE state values output for a clock cycle.

16. The method as set forth in claim 15, wherein step (b) further comprises storing trace data into the trace memory units in a wrap around manner.

17. The method as set forth in claim 16, wherein the method further comprises the step of (c) storing a plurality of identical sync patterns in a sync memory for a trace session, one sync pattern per clock cycle, and each sync pattern being stored synchronously at the same time the corresponding signal state values of a particular clock cycle are stored into the trace memory unit.

18. A computer system comprising means for compiling and mapping a circuit design to logic elements (LE) of an emulation system including means for generating a cross reference file for cross referencing circuit elements of the circuit design to relative memory locations within a block of memory locations of a trace memory used to store a clock cycle of signal state values of the LEs where the signal state values of the LEs onto which the circuit elements are mapped are stored, the emulation system being equipped to capture and store signal state values of all LEs in the trace memory on a clock cycle by clock cycle basis, employing a deterministic locality topology.

19. The computer system as set forth in claim 18, wherein the cross reference file comprises a plurality of cross reference records, each cross reference record having identification information of a circuit element, and one or more offset values into each block of memory locations for storing a clock cycle of LE state signal values where the signal state value of the LE onto the circuit element is mapped is stored.

20. In a computer system, a method for compiling and mapping a circuit design to logic elements (LE) of an emulation system, the method comprising the step of generating a cross reference file for cross referencing circuit elements of the circuit design to relative memory locations within a block of memory locations of a trace memory used to store a clock cycle of signal state values of the LEs where the signal state values of the LEs onto which the circuit elements are mapped are stored, the emulation system being equipped to capture and store signal state values of all LEs in the trace memory on a clock cycle by clock cycle basis, employing a deterministic locality topology.

21. The method as set forth in claim 20, wherein the generation step comprises generating a plurality of cross reference records, each cross reference record having identification information of a circuit element, and one or more offset values into each block of memory locations for storing a clock cycle of LE state signal values where the signal state value of the LE onto the circuit element is mapped is stored.

* * * * *